(12) United States Patent
Shen et al.

(10) Patent No.: US 8,212,347 B2
(45) Date of Patent: Jul. 3, 2012

(54) STACKED CHIP PACKAGE STRUCTURE WITH LEADFRAME HAVING BUS BAR

(75) Inventors: Geng-Shin Shen, Hsinchu (TW); Wu-Chang Tu, Hsinchu (TW)

(73) Assignees: ChipMOS Technologies Inc, Hsinchu (TW); ChipMOS Technologies (Bermuda) Ltd, Hamilton (BM)

( * ) Notice: Subject to any disclaimer, the term of this patent is extended or adjusted under 35 U.S.C. 154(b) by 101 days.

(21) Appl. No.: 12/827,076

(22) Filed: Jun. 30, 2010

(65) Prior Publication Data

US 2010/0264527 A1    Oct. 21, 2010

Related U.S. Application Data

(63) Continuation of application No. 11/826,415, filed on Jul. 16, 2007, now Pat. No. 7,786,595.

(30) Foreign Application Priority Data

Sep. 12, 2006 (TW) ............................. 95133670 A

(51) Int. Cl.
*H01L 23/02* (2006.01)
*H01L 23/495* (2006.01)

(52) U.S. Cl. . 257/686; 257/666; 257/784; 257/E23.052; 257/777; 257/E23.141

(58) Field of Classification Search ............... 257/666, 257/686, 784, E23.052, E23.141, 777
See application file for complete search history.

(56) References Cited

U.S. PATENT DOCUMENTS

| | | | |
|---|---|---|---|
| 5,334,803 A | 8/1994 | Yamamura et al. | |
| 5,373,189 A | 12/1994 | Massit et al. | |
| 5,473,196 A | 12/1995 | De Givry | |
| 5,998,864 A | 12/1999 | Khandros et al. | |
| 6,133,626 A | 10/2000 | Hawke et al. | |
| 6,261,865 B1 | 7/2001 | Akram | |
| 6,376,904 B1 | 4/2002 | Haba et al. | |
| 643,742 A1 | 8/2002 | Choi | |
| 6,461,897 B2 | 10/2002 | Lin et al. | |
| 6,514,794 B2 | 2/2003 | Haba et al. | |
| 6,605,875 B2 | 8/2003 | Eskildsen | |
| 6,621,155 B1 | 9/2003 | Perino et al. | |
| 663,037 A1 | 10/2003 | Punzalan et al. | |
| 6,630,373 B2 * | 10/2003 | Punzalan et al. | 438/123 |
| 6,650,008 B2 * | 11/2003 | Tsai et al. | 257/686 |
| 6,759,307 B1 | 7/2004 | Yang | |
| 6,843,421 B2 | 1/2005 | Chhor et al. | |
| 6,900,528 B2 * | 5/2005 | Mess et al. | 257/686 |
| 6,949,835 B2 | 9/2005 | Konishi et al. | |
| 7,015,586 B2 | 3/2006 | Chien | |

(Continued)

*Primary Examiner* — Nitin Parekh
(74) *Attorney, Agent, or Firm* — Ming Chow; Sinorica, LLC

(57) ABSTRACT

The present invention provides a chip-stacked package structure with leadframe having bus bar, comprising: a leadframe composed of a plurality of inner leads arranged in rows facing each other, a plurality of outer leads, and a die pad, wherein the die pad is provided between the plurality of inner leads and is vertically distant from the plurality of inner leads; a chip-stacked structure formed with a plurality of chips that stacked together and set on the die pad, the plurality of chips and the plurality of inner leads being electrically connected with each other; and an encapsulant covering over the chip-stacked package structure and the leadframe, in which the leadframe comprises at least a bus bar, which is provided between the plurality of inner leads arranged in rows facing each other and the die pad.

12 Claims, 12 Drawing Sheets

U.S. PATENT DOCUMENTS

| | | |
|---|---|---|
| 7,095,104 B2 | 8/2006 | Blackshear |
| 7,145,247 B2 | 12/2006 | Kawano et al. |
| 7,199,458 B2 | 4/2007 | Lee |
| 2004/0164392 A1 | 8/2004 | Lee |

* cited by examiner

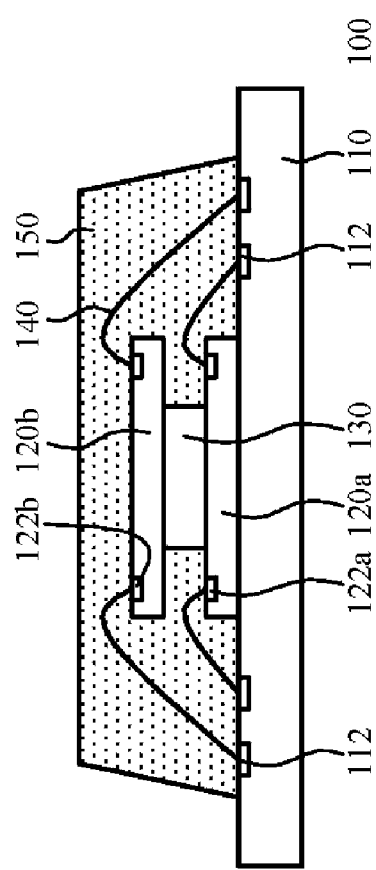
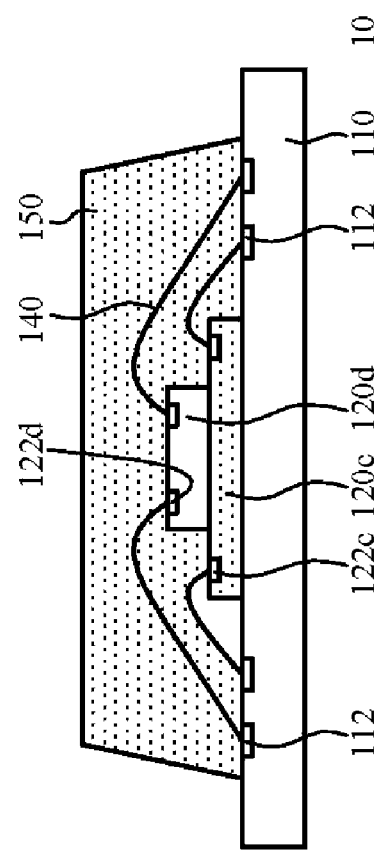
FIG. 1A
FIG. 1B

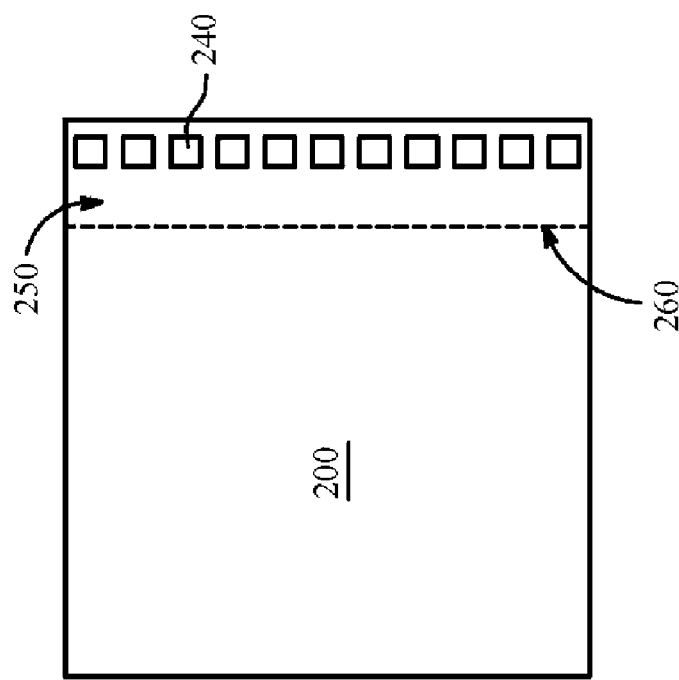
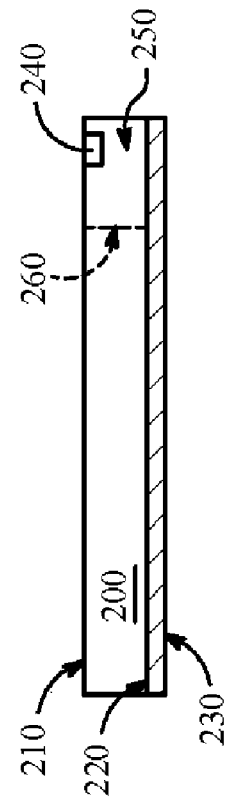
FIG. 2A
FIG. 2B

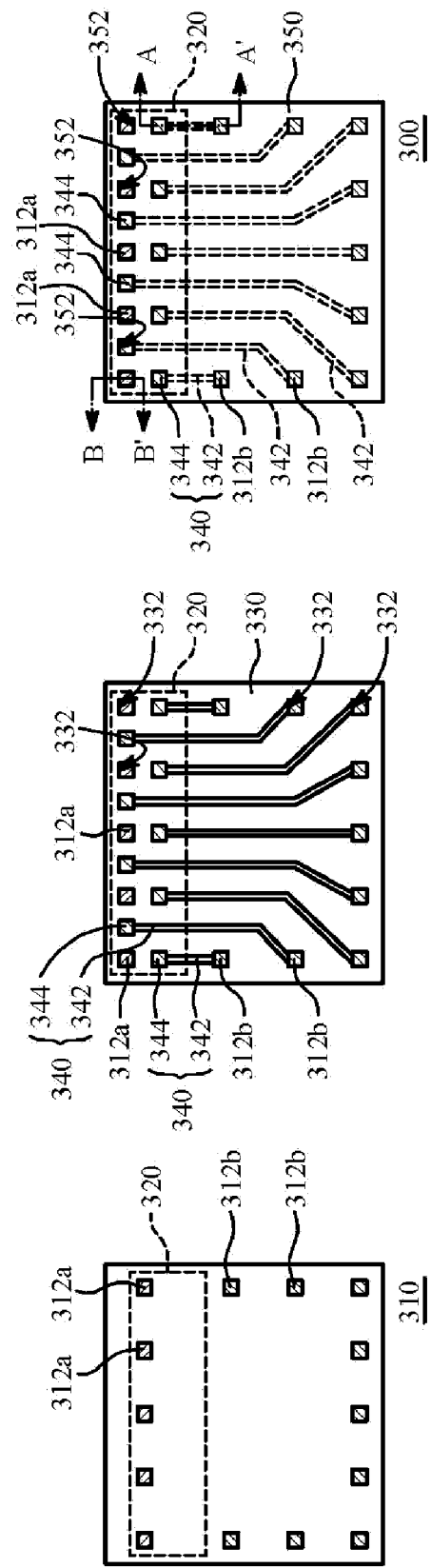

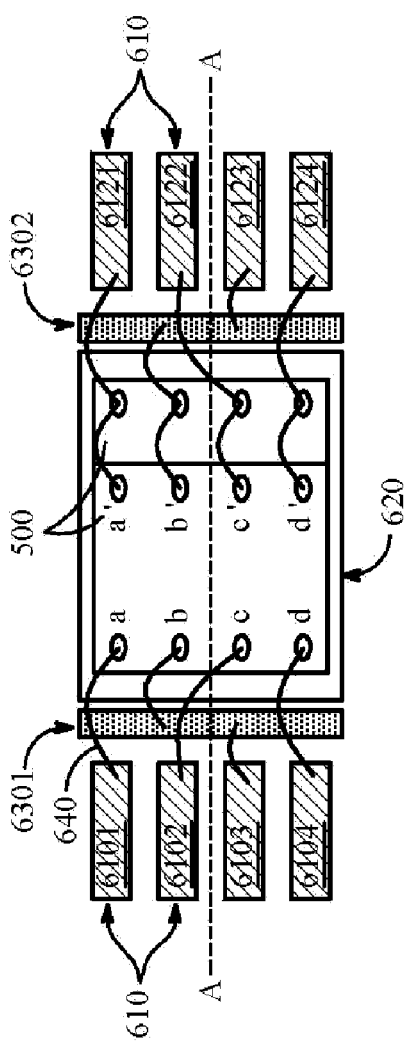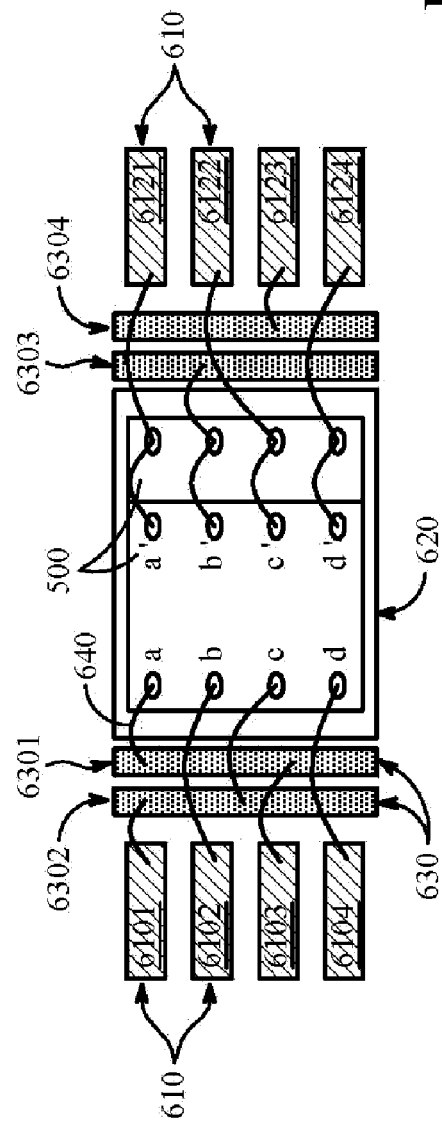

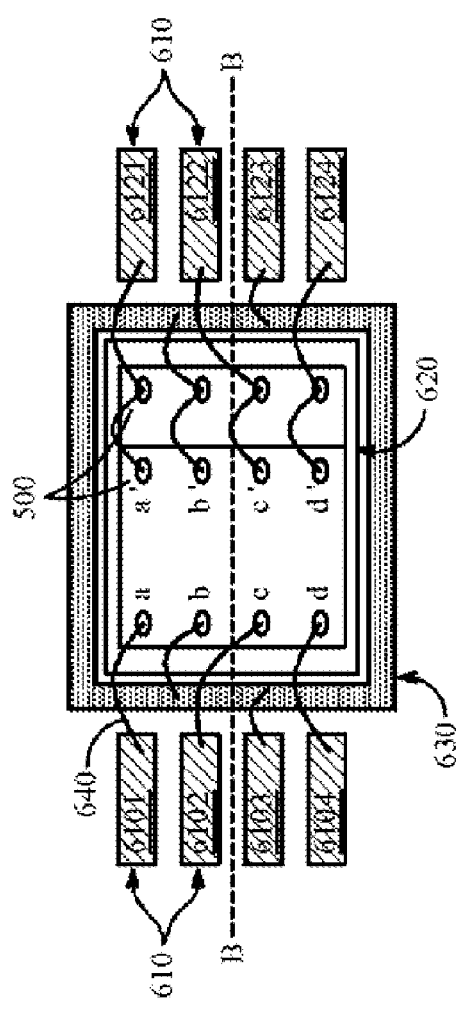
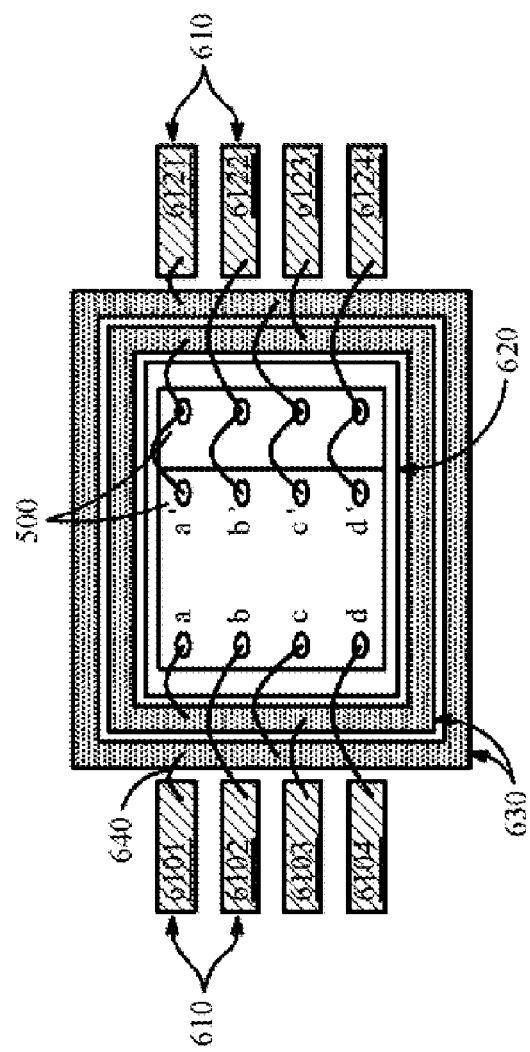
FIG. 7A
FIG. 7B

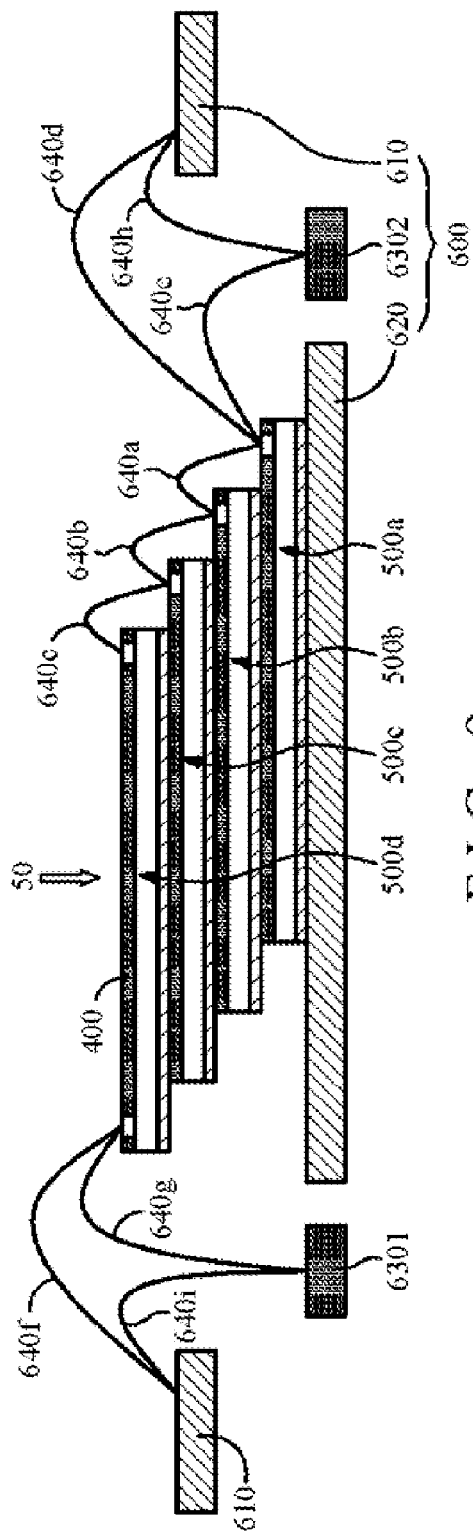
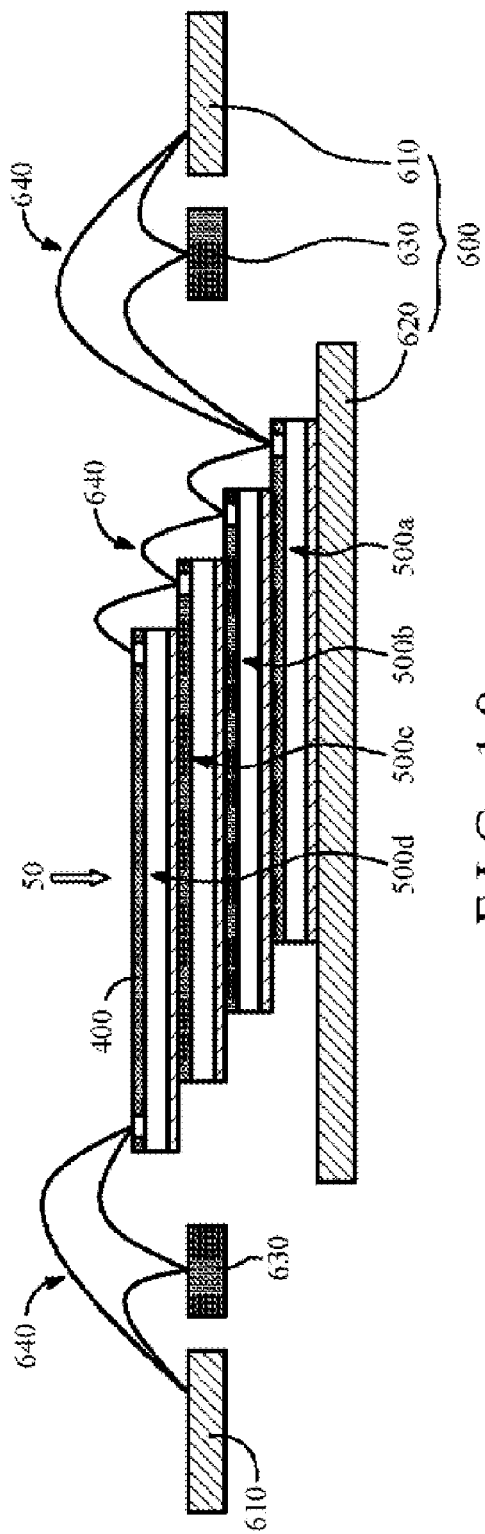
FIG. 9
FIG. 10

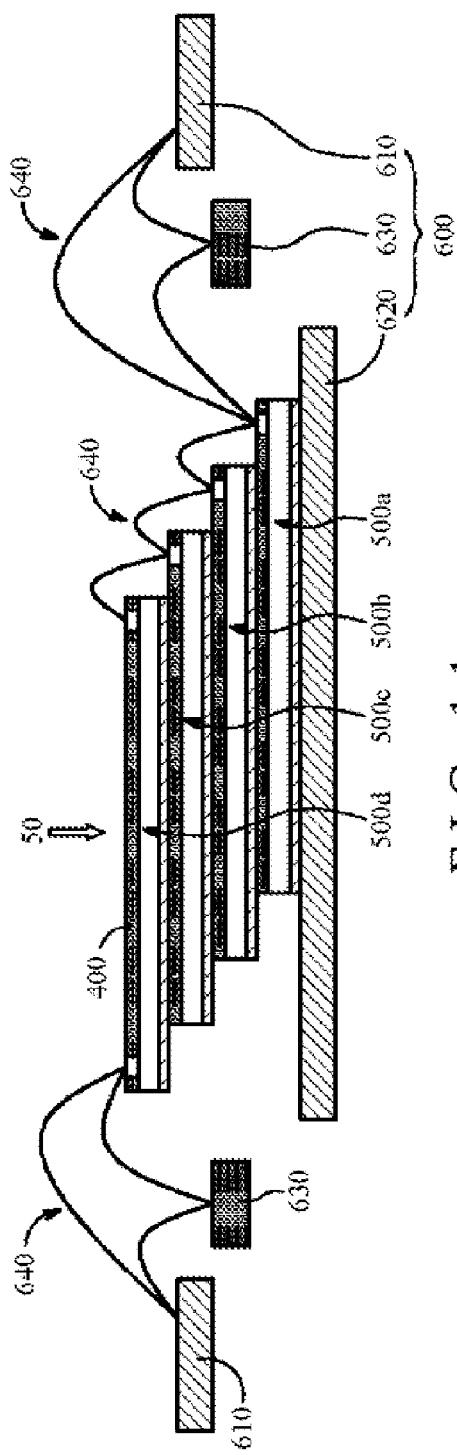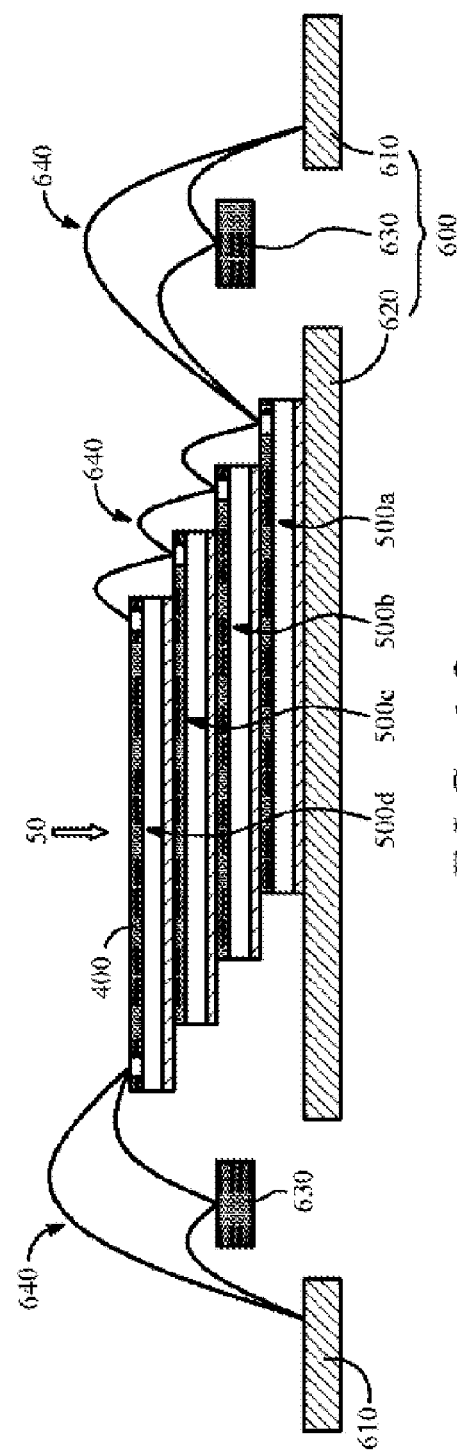
FIG. 11
FIG. 12

STACKED CHIP PACKAGE STRUCTURE WITH LEADFRAME HAVING BUS BAR

This application is a continuation application of, and claims a priority to the U.S. patent application Ser. No. 11/826,415 filed on Jul. 16, 2007, now U.S. Pat. No. 7,786,595 which claims a priority to the foreign patent application in Taiwan with a serial number TWO95133670, filed on Sep. 12, 2006.

BACKGROUND OF THE INVENTION

1. Field of the Invention

The present invention relates to an offset chip-stacked package structure, and more particularly, to an offset chip-stacked structure with leadframe having bus bar.

2. Description of the Prior Art

In semiconductor post-processing, many efforts have been made for increasing scale of the integrated circuits such as memories while minimizing the occupied area. Accordingly, the development of three-dimensional (3D) packaging technology is in progress and the idea of making up a chip-stacked structure has been disclosed.

The prior art has taught that a chip-stacked structure can be formed by firstly stacking a plurality of chips and then electrically connecting the chips to the substrate in a wire-bonding process. FIG. 1A is a cross-sectional view of a prior chip-stacked package structure stacked by chips of same or similar size. As shown in FIG. 1A, a conventional chip-stacked package structure 100 includes a package substrate 110, chips 120a and 120b, a spacer 130, wires 140, and an encapsulant 150. The package substrate 110 has a plurality of pads 112 thereon, and the chips 120a and 120b are also respectively provided with the pads 122a and 122b arranged in peripheral type. The chip 120a is provided on the substrate 110, while the chip 120b is provided on the chip 120a with a spacer 130 intervened there-between. The chip 120a is electrically connected to the substrate 110 by bonding two ends of one of the wires 140 to the pads 112 and 122a respectively. The chip 120b is electrically connected to the substrate 110 in similar manner. The encapsulant 150 is then provided on the substrate 110 to cover the chips 120a and 120b and the wires 140.

Since the pads 122a and 122b are respectively provided at the peripheral of the chip 120a and the 120b, there is a need to apply the spacer 130 to prevent the chip 120b from directly contacting with the chip 120a for performing the subsequent wire-bonding. However, the use of spacer 130 increases the thickness of the chip-stacked package structure 100.

Another prior chip-stacked package structure for different-sized chips has been disclosed. Referring to FIG. 1B, another conventional chip-stacked package structure 10 includes a package substrate 110, chips 120c and 120d, wires 140, and an encapsulant 150. The substrate 110 has pads 112 on it. The chip 120c is larger than the chip 120d in size. The chips 120c and 120d are respectively provided with peripherally arranged pads 122c and 122d. The chip 120c is provided on the substrate 110 while the chip 120d is provided on the chip 120c. The chip 120c is electrically connected to the substrate 110 by bonding two ends of one of the wires 140 to the pads 112 and 122c respectively. The chip 120d is electrically connected to the substrate 110 in similar manner. The encapsulant 150 is then provided on the substrate 110 to cover the chips 120c and 120d and the wires 140.

Since the chip 120d is smaller than the chip 120c, the chip 120d would not covered over the pads 122c of the chip 120c when the chip 120d is stacked on the chip 120c. However, the condition that the upper chip must have size smaller than that of the lower chip limits number of the chips to be stacked in the chip-stacked package structure 10.

In other words, the above-mentioned chip-stacked package structures have drawbacks of either increasing thickness as shown in FIG. 1A or limiting number of the chips to be stacked as shown in FIG. 1B.

SUMMARY OF THE INVENTION

In view of the drawbacks and problems of the prior chip-stacked package structure as mentioned above, the present invention provides a three-dimensional chip-stacked structure for packaging multi-chips with similar size.

It is an object of the present invention is to provide a leadframe structure provided with bus bar for offset chip stacking and packaging and so as to the package has higher density and thinner thickness.

It is another object of the present invention to provide an offset chip-stacked structure for packaging with a leadframe that having bus bar structure and so as to make the circuit design more flexible and gain higher reliability.

According to abovementioned objects, the present invention provides an offset chip-stacked package structure with leadframe having bus bar, comprising: a leadframe composed of a plurality of inner leads arranged in rows facing each other, a plurality of outer leads, and a die pad, wherein the die pad is provided between the plurality of inner leads and is vertically distant from the plurality of inner leads; a plurality of stacked semiconductor chip structures being misaligned for forming an offset chip-stacked structure on the die pad, the plurality of chips on the offset chip-stacked structure and the plurality of inner leads being electrically connected with each other; and an encapsulant covering the plurality of semiconductor chip structures and the leadframe; wherein the leadframe comprises at least a bus bar, which is provided between the plurality of inner leads arranged in rows facing each other and the die pad.

The present invention then provides an offset chip-stacked package structure with leadframe having bus bar, comprising: a leadframe composed of a plurality of outer leads, a plurality of inner leads arranged in rows facing each other, and a die pad, wherein the die pad is provided between the plurality of inner leads and is vertically distant from the plurality of inner leads; a plurality of offset chip-stacked structures set on the die pad and electrically connected to the plurality of inner leads arranged in rows facing each other; and an encapsulant covering the plurality of offset chip-stacked structures and the leadframe, the plurality of outer leads extending out of the encapsulant; wherein the leadframe comprises at least a bus bar provided between the plurality of inner leads and the die pad.

BRIEF DESCRIPTION OF THE DRAWINGS

FIG. 1A to 1B are diagrams schematically showing a conventional chip-stacked package structure.

FIG. 2A is a top-elevational view schematically showing the chip-stacked structure according to the present invention.

FIG. 2B is a cross-sectional view schematically showing the chip-stacked structure according to the present invention.

FIGS. 3A to 3C are diagrams schematically showing the redistribution layer formed in a process according to the present invention.

FIGS. 6A to 6B are top-elevational views schematically showing an offset chip-stacked package structure according to the present invention.

FIGS. 7A to 7B are top-elevational views schematically showing an offset chip-stacked package structure according to another embodiment of the present invention.

FIG. 9 is a cross-sectional view schematically showing an offset chip-stacked package structure according to the present invention.

FIG. 10 is a cross-sectional view schematically showing an offset chip-stacked package structure according to an embodiment of the present invention.

FIG. 11 is a cross-sectional view schematically showing an offset chip-stacked package structure according to another embodiment of the present invention.

FIG. 12 is a cross-sectional view schematically showing an offset chip-stacked package structure according to another embodiment of the present invention.

DESCRIPTION OF THE PREFERRED EMBODIMENT

The present invention will now be described more fully hereinafter with reference to the accompanying drawings, in which preferred embodiments are shown. In the following, the well-known knowledge regarding the chip-stacked structure of the invention such as the formation of chip and the process of thinning the chip would not be described in detail to prevent from arising unnecessary interpretations. However, this invention will be embodied in many different forms and should not be construed as limited to the embodiments set forth herein.

According to the semiconductor packaging process, a Front-End-Process experienced wafer is performed a thinning process to reduce the thickness to a value between 2 mil and 20 mil, and then the polished wafer is applied with a polymer material such as a resin or a B-Stage resin by coating or printing. Next, a post-exposure baking or lighting process is applied to the polymer material so that the polymer material becomes a viscous semi-solidified gel-like material. Subsequently, a removable tape is attached to the gel-like material with capable of viscous semi-solidified, and then the wafer is sawed into chips or dies. At last, these chips or dies are stacked on and connected to a substrate to form a chip-stacked structure.

Figure 2C:
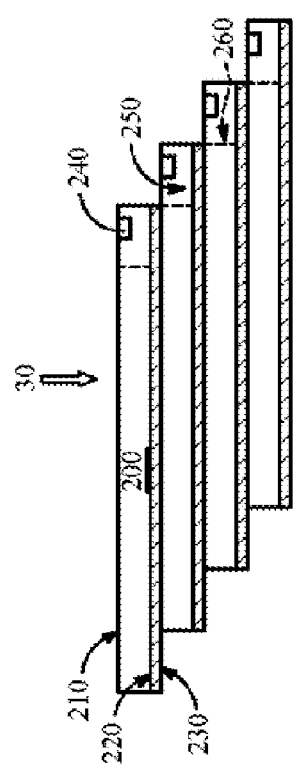
FIGS. 2C to 2E are cross-sectional views schematically showing the offset chip-stacked structure according to the present invention.

Referring to FIGS. 2A and 2B, a chip 200 experiencing the above-mentioned processes has an active surface 210 and a back surface 220 in opposition to the active surface 210 with an adhesive layer 230 that is formed on the back surface 220. It is to be noted that the adhesive layer 230 is not limited to the above-mentioned semi-solidified gel-like material and can be any adhesive material, such as die-attached film, for joining the chip 200 and a substrate together. Moreover, the active surface 210 is thereon provided with a plurality of pads 240 arranged along a side edge. Accordingly, an offset chip-stacked structure 30 as shown in FIG. 2C can be formed. The offset chip-stacked structure 30 is a ladder-like structure formed by aligning the side edge of upper chips with the edge line 260 of the bonding area 250 on lower chips. The edge line 260 herein is a presumed line for reference only but not a line exists on chip 200.

Figure 2D:
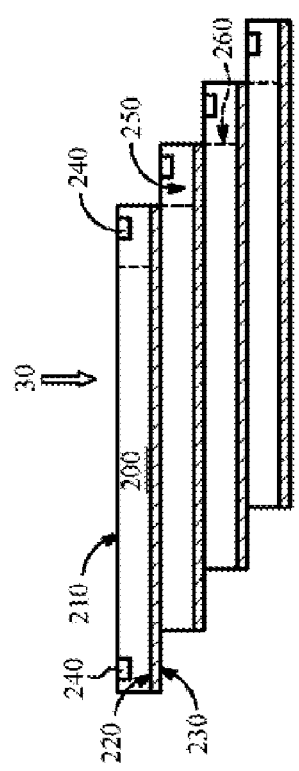
Figure 2E:
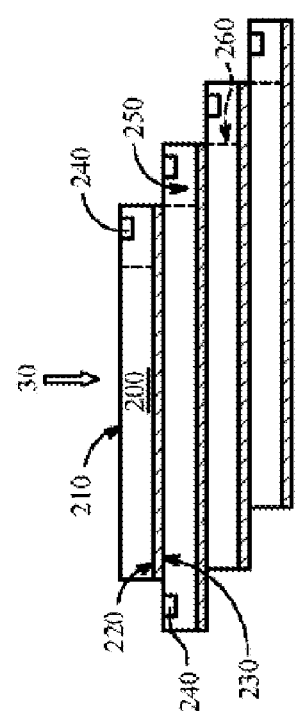

Referring to FIG. 2D, the uppermost chip of the structure 30 can further have same pads as the pads 240 on the other side for providing more connections with the substrate. Referring to FIG. 2E, the uppermost chip of the structure 30 can have size smaller than that of the lower one. The arrangement of the pads 240 or the size of the chips described herein is for embodying but not limiting the invention. Any chip-stacked structure satisfying the above-mentioned statement would be regarded as an aspect of the invention.

Referring to FIGS. 3A to 3C, the process of making a chip with a redistribution layer is disclosed. According to the present invention, the redistribution layer (RDL) is formed with a plurality of pads provided on one side edge of the chip and the details are described as follows.

As shown in FIG. 3A, the chip 310 has first pads 312a and second pads 312b on the active surface and along side edges. The first pads 312a are located inside a bonding area 320, while the second pads 312b are located outside the bonding area 320. As shown in FIG. 3B, a first passivation layer 330 with a plurality of first openings 332 for exposing the first pads 312a and the second pads 312b is first formed on the chip 310, and a redistribution layer 340 with a plurality of conductive wires 342 and a plurality of third pads 344 is then formed on the first passivation layer 33. The third pads 344 are located inside the bonding area 320 and the plurality of conductive wires 342 that is electrically connected to the second pads 312b and the third pads 344. The redistribution layer 340 is made up of conductive materials such as gold, copper, nickel, titanium tungsten, titanium or others. As shown in FIG. 3C, the chip structure 300 is completed by forming a second passivation layer 350 with a plurality of second openings 352 on the redistribution layer 340 to cover the area rather than the first pads 312a and the third pads 344 but expose the first pads 312a and the third pads 344.

It is to be noted that the first pads 312a and the second pads 312b can be arranged on the surface of the chip 310 not only in the above-mentioned peripheral type but also in an area array type or other types rather than the above-mentioned types, provided that the second pads 312b are electrically connected with the third pads 344 via the conductive wires 342. Moreover, the third pads 344 can be arranged in a manner of being along side edge of the chip 310 and in parallel to the pads 312a such as shown in FIG. 3B or other manners provided that the third pads 344 are located inside the bonding area 320.

Figure 4A:
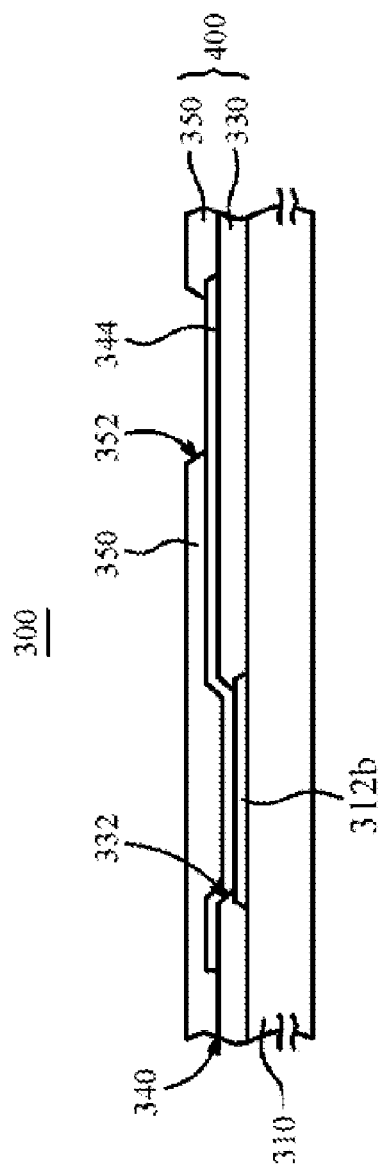
FIGS. 4A to 4B are cross-sectional views schematically showing the bonding area on the redistribution layer according to the present invention.
Figure 4B:
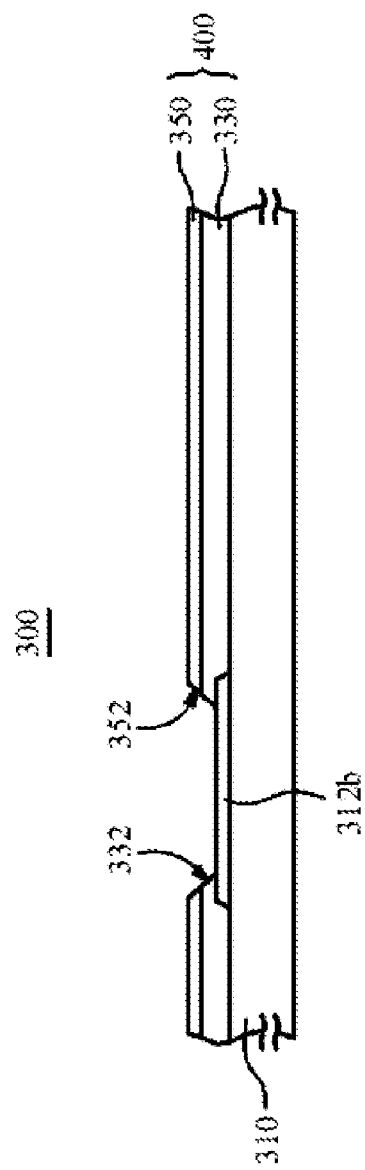

Referring now to FIGS. 4A and 4B, show the cross-section views drawn along section lines A-A' and B-B'. As shown in FIGS. 4A and 4B, the whole chip structure 300 is composed of the chip 310 and the redistribution layer 400. The redistribution layer 400 is composed of first passivation layer 330, redistribution layer 340, and second passivation layer 350. The presumed bonding area 320 of the chip 310 is a side edge adjacent to the chip 310. Moreover, the chip 310 has a plurality of first pads 312a and second pads 312b, wherein the first pads 312a are inside the bonding area 320 and the second pads 312b are outside the bonding area 320.

The first passivation layer 330 disposed on the chip 310 has a plurality of first openings 332 to expose these first pads 312a and second pads 312b. The redistribution layer 340 with a plurality of third pads 344 is disposed on the first passivation layer 330 and extends from second pads 312b to presumed bonding area 320, where the third pads are located. The second passivation layer 350 covers the redistribution layer 340 and expose first pads 312a and third pads 344 through a plurality of second openings 352. Since the first pads 312a and third pads 344 are in the presumed bonding area 320, the area rather than the bonding area 320 on the second passivation layer 350 is capable of carrying another chip structure and therefore accomplishing an offset chip-stacked structure.

Figure 5A:
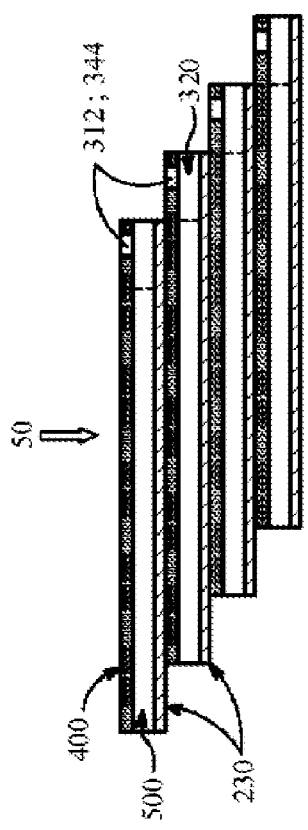
FIGS. 5A to 5C are cross-sectional views schematically showing an offset chip-stacked structure with redistribution layer according to the present invention.
Figure 5B:
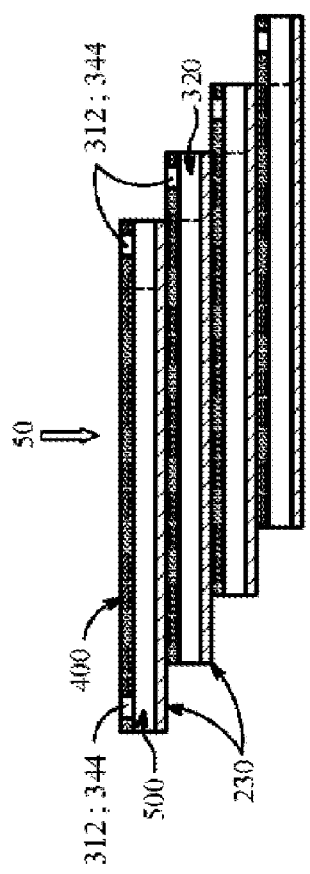
Figure 5C:
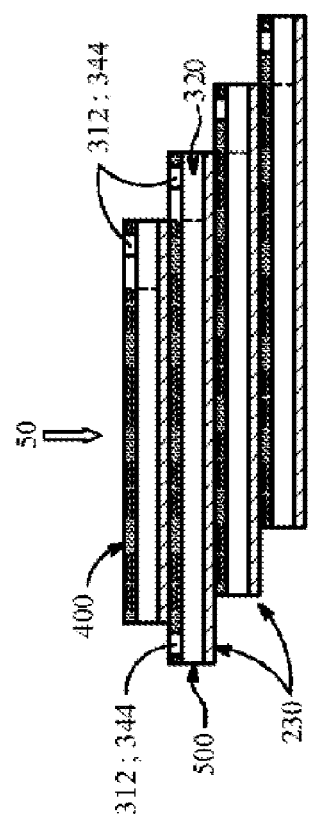

Referring to FIG. 5, shows an offset chip-stacked structure 50 of the present invention. An offset chip-stacked structure 50 includes a plurality of stacked chips 500. Each of the chips 500 is formed with a redistribution layer 400 so that each of the chips 500 can be provided with pads inside the bonding area 320 on each chip. In this way, the offset chip-stacked structure 50 is formed by aligning the side edge of upper chips with a presumed edge line of the bonding area 320 on lower chips and an adhesive layer 230 formed by a polymer material is used to connect any two chips among the plurality of chips 500. Moreover, as shown in the present embodiment in FIG. 5B, the uppermost chip of the offset chip-stacked structure 50 can further have same pads as the pads 312 on the other side for providing more connections with the substrate and the method for forming this kind of structure is as shown in FIG. 4. Referring to FIG. 5C, the uppermost chip of the offset chip-stacked structure 50 can have size smaller than that of the lower one. The arrangement of the pads 312 and 344 or the size of the chips 500 described herein is for embodying but not limiting the invention. Any chip-stacked structure satisfying the above-mentioned statement would be regarded as an aspect of the invention. For example, each of the chips 500 can be formed with bonding areas that are not only on the right side as shown in FIGS. 5A to 5B but also on the left side.

In the following, two offset chip-stacked structures each connected with leadframes according to the present invention will be disclosed, in which the above-mentioned offset chip-stacked structure 50 will be taken as an example for illustration. However, the following descriptions can also be applied to the above-mentioned offset chip-stacked structure 30.

Referring to FIGS. 6A and 6B, shows the plane views of a chip-stacked package structure of the present invention. As shown in FIGS. 6A and 6B, the chip-stacked package structure comprises a leadframe 600 and an offset chip-stacked structure 50, wherein the leadframe 600 is composed of a plurality of inner leads 610 arranged in rows facing each other, a plurality of outer leads (not shown), and a die pad 620. The die pad 620 is provided between the plurality of inner leads 610 and is vertically distant from the plurality of inner leads. In the present embodiment, the offset chip-stacked structure 50 is fixedly connected to the die pad 620 with an adhesive layer 230. The adhesive layer 230 in the present invention is not limited to the above-mentioned semi-solidified gel-like material and can be any adhesive material, such as die attached film, for joining the offset chip-stacked structure 50 and the die pad 620 together. Then metal wires 640 are provided for connecting chip-stacked structure 50 and the inner leads 610 of leadframe 600.

Figure 8A:
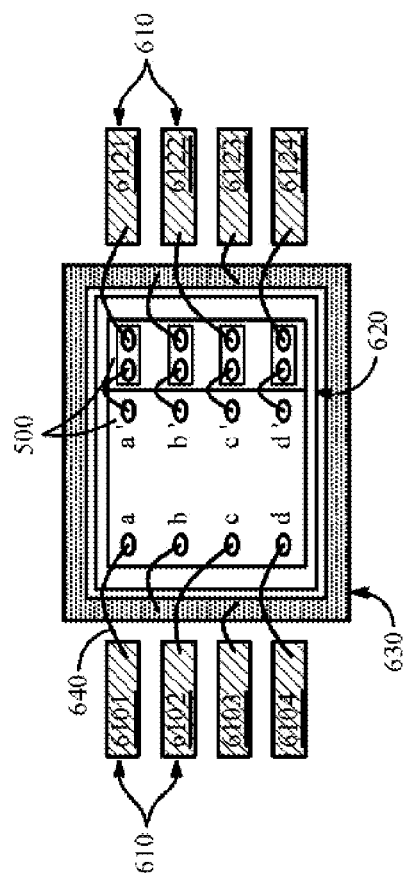
FIGS. 8A to 8B are top-elevational views schematically showing an offset chip-stacked package structure according to another embodiment of the present invention.
Figure 8B:
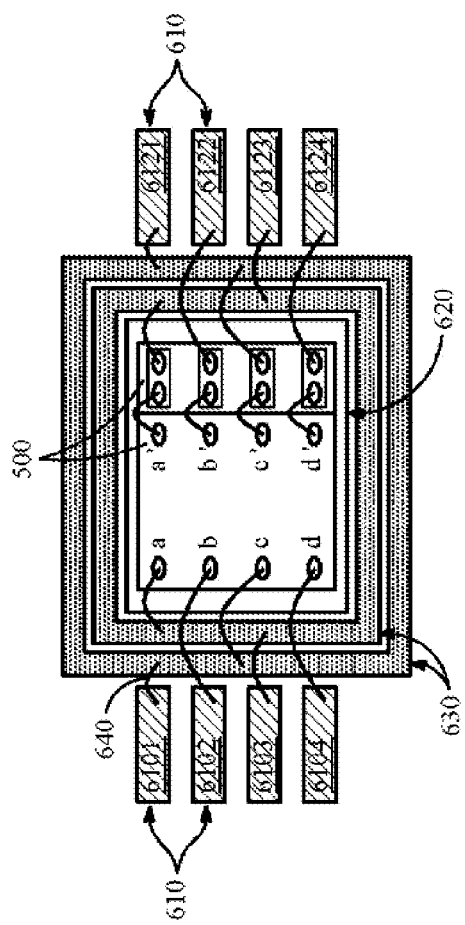

Then, referring to FIGS. 6A and 6B, the leadframe 600 of chip-stacked package structure of the present invention further comprises at least a bus bar 630 provided between the die pad 620 and the plurality of inner leads 610 arranged in rows facing each other, wherein the bus bar 630 can be arranged in a stripe-shaped configuration, as shown in FIGS. 6A and 6B; meanwhile, the bus bar 630 can also be arranged in a ring-shaped configuration, as shown in FIGS. 7A and 7B. Moreover, as what is described above, the pads 312/344 in the bonding area 320 of chip 500 can be arranged in single row, as shown in FIGS. 6 and 7, or two rows, as shown in FIGS. 8A and 8B, and is not limited in the present invention.

The description will go to the part of using the bus bar 630 to accomplish jumping connections of metal wires 640, referring to FIG. 6A. Referring again to FIG. 6A, the pad with letter "b" and the pad with letter "b'" on the chip 500 are connected to the inner lead 6103 and the inner lead 6123 respectively. Apparently, the bus bar 6301 and the bus bar 6302 can be served as transferring pads for making jumping connections between the pads with letter "b" and with "b'" and the inner leads 6103 and 6123 and thus the metal wires 640 would not cross each other. For example, a metal wire 640 has its one end connected to the pads with letter "b" and with "b'" on chip 500 and the other end connected to the bus bars 6301 and 6302; then another wire 640 has its one end connected to the bus bars 6301 and 6302 and the other end connected to the inner leads 6103 and 6123. Thus, the connection between the pads with letter "b" and with "b'" and the inner leads 6103 and 6123 can be made without crossing the wire connecting the pad with letter "c" and the inner lead 6102. And in another embodiment, as shown in FIG. 6B, the jumping connection of two pads on chip 500 can be accomplished with a plurality of bus bar structures 630. Referring to FIG. 6B, the pads with letter "a" and with "c'" on chip 500 are connected to the inner leads 6103 and 6101. The bus bar 6301 can be served as a transferring pad for the pad with letter "a". A metal wire 640 first connects the pad with letter "a" and the bus bar 6301, and another metal wire 640 connects the bus bar 6301 and the inner lead 6103. The bus bar 6302 can be served as a transferring pad for the connection between the pad with letter "c" and the inner lead 6101 with a metal wire 640. Moreover, on another side of the leadframe 600, the bus bar 6303 can be served as a transferring pad for the pad with letter "b'". A metal wire 640 connects the pad with letter "b'" and the bus bar 6303, and another metal wire 640 connects the bus bar 6303 and the inner lead 6123. Consequently, the bus bars 630 in the leadframe 600 according to the present invention provides a plurality of transfer pads for jumping connections to prevent metal wires from crossing each other and avoid unnecessary short. Meanwhile, the bus bars 630 make the circuit design more flexible and raise the reliability in package processing. The connection of metal wires can also be performed in the embodiments in FIGS. 7 and 8 according to the structure of bus bars 630.

It is to be noted that the offset chip-stacked structure 50 is set on the leadframe 600 and the chips 500 can be that having same size and performing same function such as memory chips or chips having different sizes and performing different functions such as the case shown in FIGS. 2E and 5C (the chips on the uppermost layer being drive chips and the rest being memory chips). The detailed description for size and function of these chips is omitted hereinafter.

Referring to FIG. 9, which is a cross-sectional view of the offset chip-stacked package structure in FIG. 6A drawn along section line A-A or in FIG. 7A drawn along section line B-B. As shown in FIG. 9, the leadframe 600 and the offset chip-stacked structure 50 are connected with a plurality of metal wires 640, wherein the leadframe 600 is composed of a plurality of inner leads 610 arranged in rows facing each other, a plurality of outer leads (not shown), and a die pad 620. The die pad 620 is provided between the plurality of inner leads 610 and is vertically distant from the plurality of inner leads 610, at least a bus bar 630 being provided between the inner leads 610 and the die pad 620. In the present embodiment, the bus bar 630 and the die pad 620 are vertically at the same height.

The metal wire 640a has one end connected to the first pad 312a or third pad 344 of the chip 500a (first pad 312a or third pad 344 described in FIG. 3 for example) and has the other end connected to the first pad 312a or third pad 344 of the chip 500b in a wire-bonding process. Similarly, the metal wire 640b has one end that connected to the first pad 312a or third pad 344 of the chip 500b and has the other end that connected to the first pad 312a or the third pad 344 of the chip 500c via a wire-bonding process. The metal wire 640c has one end that connected to the first pad 312a or third pad 344 of the chip 500c and has the other end that connected to the first pad 312a or the third pad 344 of the chip 500d via a wire-bonding process. The metal wire 640d has one end connected to the first pad 312a or third pad 344 of the chip 500a and has the other end connected to the inner leads 610 in a wire-bonding process. In this way, the chips 500a, 500b, 500c and 500d are electrically connected to the leadframe 600 when the wire-bonding processes of the metal wires 640a, 640b, 640c, and 640d are completed, wherein these metal wires 640 can be gold made wires.

Moreover, the leadframe 600 is provided with bus bar 630 as transferring pad for electrical connections such as power connections, ground connections, or signal connections. For example, when the bus bar 630 is served as transferring pad for electrical connection, the metal wire 640e has its one end connected to a pad (pad with letter "b'" for example) of the chip 500a and has its other end connected to a bus bar (the bus bar 6302 for example), and the metal wire 640h has its one end connected to the bus bar 6302 and has its other end connected to one of the inner leads (inner lead 6122 for example). Moreover, the uppermost chip 500d of the structure 50 can further have same pads as the pads 312 and 344 on the other side such as the arrangement shown in FIGS. 2D and 5B. Therefore, on the other side of chip 500d, a plurality of metal wires 640f are used to connect the chip 500d (pad with letter "a" for example) and the inner leads 610 (inner lead 6102 for example), while a metal wire 640g has its one end connected to a pad (pad with letter "b" for example) of chip 500d and the other end connected to a bus bar (bus bar 6301 for example) and a metal wire 640i is used to connect the bus bar 6301 and one of the inner leads (inner lead 6103 for example).

It is to be noted that the chip 500b is stacked on and adhered to the area outside the bonding area 320 of the chip 500a via a polymer material made adhesive layer. However, the wire-bonding sequence of the metal wires 640 is not limited herein, which means it is also allowable to first bond the uppermost chip 500d and finally bond the lowermost chip 500a and then connect the chip 500a with the leadframe 600.

Referring to FIG. 10, which is a cross-sectional view of another embodiment of offset chip-stacked package structure in FIG. 6A drawn along section line A-A or in FIG. 7A drawn along section line B-B. As shown in FIG. 10, the leadframe 600 and the offset chip-stacked structure 50 are connected with a plurality of metal wires 640, wherein the leadframe 600 is composed of a plurality of inner leads 610 arranged in rows facing each other, a plurality of outer leads (not shown), and a die pad 620. The die pad 620 is provided between the plurality of inner leads 610 and is vertically distant from the plurality of inner leads 610, at least a bus bar 630 being provided between the inner leads 610 and the die pad 620. In the present embodiment, the bus bar 630 and the inner leads 610 are vertically at the same height. After the offset chip-stacked structure 50 and the leadframe 600 are connected, the wire bonding process between the leadframe 600 and the offset chip-stacked structure 50 is then performed. The process of connecting the leadframe 600 and the offset chip-stacked structure 50 with metal wires 640 is the same as what is described above and would not be given unnecessary detail. Meanwhile, the leadframe 600 in the present embodiment is provided with bus bar 630 which can be used for electrical connections such as power connections, ground connections or signal connections via the connection of metal wires 640.

Then, referring to FIG. 11, which is a cross-sectional view of another embodiment of offset chip-stacked package structure in FIG. 6A which drawn along section line A-A or in FIG. 7A which drawn along section line B-B. The only difference between the leadframe and the offset chip-stacked structure 50 in FIG. 11 and those in FIGS. 9 and 10 is that the bus bar 630 is vertically at different heights, wherein the bus bar 630 in FIG. 11 is provided between the inner leads 610 and the die pad 620 of leadframe 600, the bus bar 630 being vertically distant from the inner leads 610 and the die pad 620. Similarly, after the offset chip-stacked structure 50 and the leadframe 600 are connected, the wire bonding process of metal wires 640 between the leadframe 600 and the offset chip-stacked structure 50 is then performed. The process of connecting the leadframe 600 and the offset chip-stacked structure 50 with metal wires 640 is the same as what is described above and would not be given unnecessary detail. Meanwhile, the leadframe 600 in the present embodiment is provided with bus bar 630 which can be used for electrical connections such as power connections, ground connections or signal connections.

Then, referring to FIG. 12, which is a cross-sectional view of still another embodiment of offset chip-stacked package structure in FIG. 6A drawn along section line A-A or in FIG. 7A drawn along section line B-B. The leadframe 600 in the present embodiment is composed of a plurality of inner leads 610 arranged in rows facing each other, a plurality of outer leads (not shown), and a die pad 620. The die pad 620 is provided between the plurality of inner leads 610 and is vertically at the same height as the plurality of inner leads 610, at least a bus bar 630 being provided between the inner leads 610 and the die pad 620. The bus bar 630 is vertically distant from the inner leads 610 and the die pad 620. Similarly, after the offset chip-stacked structure 50 and the leadframe 600 are connected, the wire bonding process of metal wires 640 between the leadframe 600 and the offset chip-stacked structure 50 is then performed. The process of connecting the leadframe 600 and the offset chip-stacked structure 50 with metal wires 640 is the same as what is described above and would not be given unnecessary detail. Meanwhile, the leadframe 600 in the present embodiment is provided with bus bar 630 which can be used for electrical connections such as power connections, ground connections or signal connections.

Figure 13:
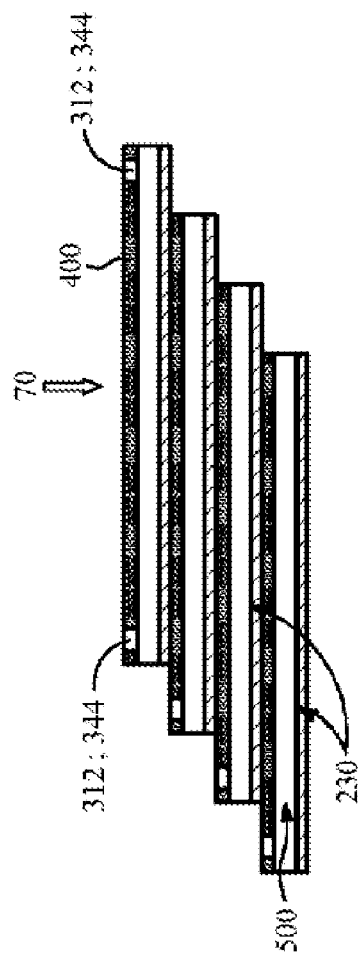
FIG. 13 is a cross-sectional view schematically showing an offset chip-stacked structure according to another embodiment of the present invention.

As described in the above embodiments, the number of the chips of the chip-stacked structure 50 is not limited, and any skilled in the art could manufacture a chip-stacked structure including at least three chips according to the above-disclosed method. Meanwhile, the direction toward which the offset of each chip occurs in forming the structure 50 is not so limited by the above-disclosed embodiments. The chip-stacked structure can be formed with each chip having an offset toward the direction opposite to the original one disclosed in the above embodiments, as shown in FIG. 13. Referring to FIG. 13, the connection method for the chips of the structure 70 and the wire-bonding method for the chips and the leadframe are similar to that disclosed in the above-mentioned embodiments and would not be given unnecessary details herein.

Figure 14:
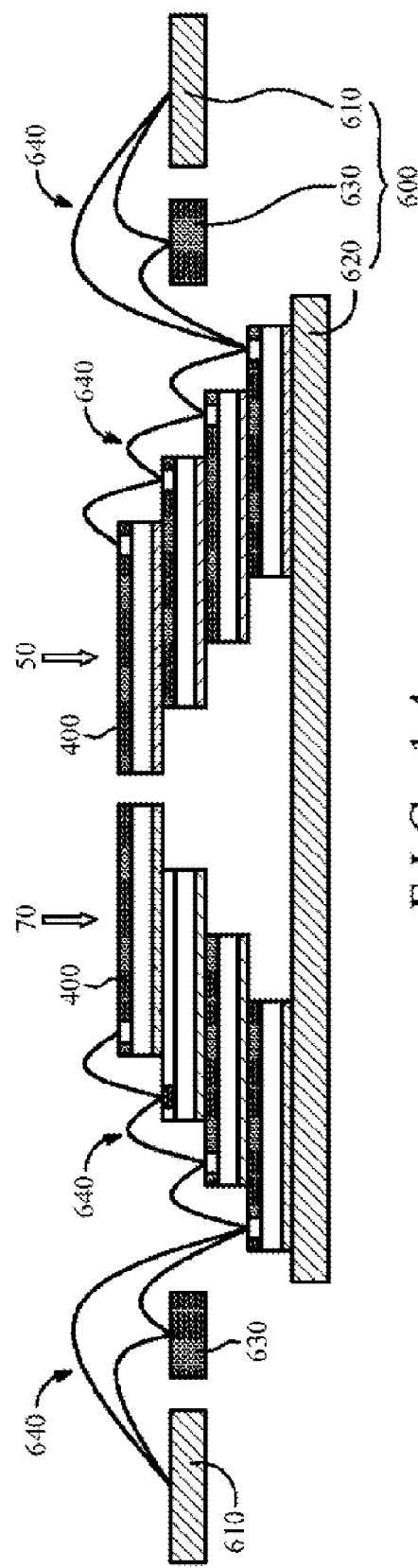
FIG. 14 is a cross-sectional view schematically showing an offset chip-stacked structure according to another embodiment of the present invention.

Moreover, the present invention proposes a combination structure in which two offset chip-stacked structure with chips of each structure being offset toward opposite directions are combined together. An example of such is shown in FIG. 14. Referring to FIG. 14, the structures 50 and 70 are provided together on a die pad 620 of a leadframe 600. The connection method for the chips of the structures 70 and 50 and the wire-bonding method for the chips and the leadframe are similar to that disclosed in the above-mentioned embodiments and would not be given unnecessary details herein. Moreover, the leadframe 600 in the present embodiment is provided with bus bar 630 as transferring pad for electrical connections such as power connections, ground connections, or signal connections. It is to be noted that the configuration and the number of the bus bar 630 here are examples only and do not limit the structure and the number of bus bar 630 when different circuit designs are considered.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A chip-stacked package structure with leadframe having bus bar, comprising:
   a leadframe, composed of a plurality of inner leads arranged in rows facing each other, a plurality of outer leads, and a die pad, wherein said die pad is provided between said plurality of inner leads arranged in rows facing each other;
   a plurality of offset chip-stacked structures set on said die pad and electrically connected to said plurality of inner leads arranged in rows facing each other; and
   an encapsulant, covering said plurality of offset chip-stacked structures and said leadframe, said plurality of outer leads extending out of said encapsulant;
   wherein said leadframe comprises at least a bus bar provided between said plurality of inner leads arranged in rows facing each other and said die pad, and said bus bar is vertically distant from said plurality of inner leads and said die pad.

2. The chip-stacked package structure according to claim 1, wherein said bus bar is arranged in a ring-shaped configuration.

3. The chip-stacked package structure according to claim 1, wherein said bus bar is arranged in a stripe-shaped configuration.

4. The chip-stacked package structure according to claim 1, wherein said plurality of offset chip-stacked structure is selectively electrically connected to part of said bus bar.

5. The chip-stacked package structure according to claim 1, wherein said bus bar be used for electrical connections such as power connections, ground connections, or signal connections.

6. The chip-stacked package structure according to claim 1, wherein said plurality of chips forming said offset chip-stacked structure has the same size.

7. The chip-stacked package structure according to claim 1, wherein said plurality of chips forming said offset chip-stacked structure comprise a plurality of first chips having the same size and at least a second chip having size different from that of said first chips.

8. The chip-stacked package structure according to claim 1, wherein said plurality of chips forming said offset chip-stacked structure are misaligned to form offset stacking.

9. The chip-stacked package structure according to claim 1, wherein said plurality of offset chip-stacked structures comprise a first offset chip-stacked structure and a second offset chip-stacked structure, and said two offset chip-stacked structures with chips of each structure being offset toward opposite directions.

10. A chip-stacked package structure with leadframe having bus bar, comprising:
    a leadframe, composed of a plurality of inner leads arranged in rows facing each other, a plurality of outer leads, and a die pad, wherein said die pad is provided between said plurality of inner leads arranged in rows facing each other;
    a plurality of offset chip-stacked structures set on said die pad and electrically connected to said plurality of inner leads arranged in rows facing each other, wherein each of said offset chip-stacked structure comprises:
        a chip body provided with a bonding area, said bonding area being adjacent to one side edge or two neighboring side edges of said chip, wherein said chip is provided with a plurality of first pads in said bonding area and a plurality of second pads outside said bonding area;
        a first passivation layer provided on said chip, wherein said first passivation layer is provided with a plurality of first openings for exposing said plurality of first pads and said plurality of second pads;
        a redistribution layer formed with a plurality of third pads inside said bonding area, wherein said redistribution layer is provided on said first passivation layer for establishing connection between said plurality of second pads and said third pads; and
        a second passivation layer covering said redistribution layer, wherein said second passivation layer has a plurality of second openings for exposing said plurality of first pads and said plurality of third pads;
    an encapsulant, covering said plurality of offset chip-stacked structures and said leadframe, said plurality of outer leads extending out of said encapsulant;
    wherein said leadframe comprises at least a bus bar provided between said plurality of inner leads arranged in rows facing each other and said die pad, and said bus bar is vertically distant from said plurality of inner leads and said die pad.

11. The chip-stacked package structure according to claim 10, wherein said redistribution layer is made up of gold, copper, nickel, titanium tungsten, titanium or others.

12. The chip-stacked package structure according to claim 10, wherein said plurality of first pads and said plurality of third pads of said plurality of chip structures are arranged in at least one row along a side edge of the chip.

* * * * *